United States Patent [19]

Cibulka et al.

[11] Patent Number: 4,613,932

[45] Date of Patent: Sep. 23, 1986

[54] METHOD AND CIRCUIT FOR REDUCTION OF STRESS IN THYRISTORS OPERATING IN THE INDIVIDUAL EMERGENCY FIRING MODE

[75] Inventors: Frank Cibulka, Monroeville; Eric J. Stacey, Penn Hills Township, Allegheny County, both of Pa.

[73] Assignee: Westinghouse Electric Corp., Pittsburgh, Pa.

[21] Appl. No.: 761,450

[22] Filed: Aug. 1, 1985

[51] Int. Cl.[4] ............................................. H02H 7/125
[52] U.S. Cl. .......................................... 363/54; 363/57; 363/68; 361/91; 361/100; 307/252 L; 307/252 Q
[58] Field of Search ....................... 363/54, 57, 68, 50; 307/252 L, 252 Q; 361/91, 111, 100, 88, 56

[56] References Cited

U.S. PATENT DOCUMENTS

| | | |
|---|---|---|
| 3,593,038 | 7/1971 | Cavallius et al. ............... 363/68 X |
| 3,821,564 | 6/1974 | Lindblom et al. ............ 307/252 L X |
| 3,878,451 | 4/1975 | Ostlund et al. ................. 307/252 L |
| 4,028,737 | 6/1977 | Bailey ............................... 361/91 X |
| 4,044,295 | 8/1977 | Ferraiolo et al. ..................... 363/54 |
| 4,223,236 | 9/1980 | Iyotani et al. .................. 307/252 Q |
| 4,275,430 | 6/1981 | Seki et al. ......................... 363/54 X |
| 4,320,445 | 3/1982 | Kobayashi et al. .................... 363/54 |
| 4,371,909 | 2/1983 | Kano ............................... 361/100 X |

FOREIGN PATENT DOCUMENTS

58-39265 3/1983 Japan ................................. 361/100

Primary Examiner—Patrick R. Salce
Assistant Examiner—Emanuel Todd Voeltz
Attorney, Agent, or Firm—M. J. Moran

[57] ABSTRACT

The invention is a method and a circuit for the emergency firing of individual thyristors in a thyristor valve that have a protection circuit for providing an emergency gate control signal for firing the thyristor when the voltage applied thereto equals or exceeds a predetermined initial emergency voltage triggering level. In operation a thyristor is initially fired using the emergency gate control signal produced by the protection circuit when the voltage applied thereto equals or exceeds the emergency voltage triggering level. The emergency voltage triggering level is then reduced. The subsequent firing of the thyristor by the protection circuit occurs when the applied voltage equals or exceeds the reduced emergency voltage triggering level. This allows both economy of operating conditions and protection of the individual thyristor and its associated snubber circuit during prolonged emergency firing conditions.

47 Claims, 4 Drawing Figures

METHOD AND CIRCUIT FOR REDUCTION OF STRESS IN THYRISTORS OPERATING IN THE INDIVIDUAL EMERGENCY FIRING MODE

FIELD OF THE INVENTION

In general the invention relates to emergency firing circuits for thyristors and in particular to circuits for protecting individual thyristors and their associated snubber circuits that comprise a thyristor valve.

BACKGROUND OF THE INVENTION

To protect a single thyristor or any of the individual thyristors of a thyristor valve (i.e. an array of thyristors connected in series) against overvoltages caused by excessive thyristor valve voltage, by improper voltage shearing, or by the failure of individual firing control channels or signals, a backup firing circuit is used which fires an individual thyristor when its off-state voltage reaches a preset level. One conventional type of backup firing circuit uses a single breakover diode. Here the breakover diode connects the anode of the thyristor with its gate through an appropriate impedance when the applied voltage across the thyristor reaches the tripping level of the breakover diode. The resulting gate current pulse fires the thyristor. Another approach is to use a special firing circuit to initiate the gate firing pulses whenever the thyristor voltage monitored by an individual sensing circuit reaches the level required for the protective action. With these approaches the triggering voltage level to which the individual emergency firing is preset is close to the maximum voltage ratings of the thyristor. Lowering the emergency firing level would cause the protection circuit to interfere with the operation of the valve during normal overvoltage transients.

In the event of sustained overvoltage conditions or on the sustained loss of the gate control signal to an individual thyristor, the individual emergency firing circuit will be in continuous operation as long as the thyristor switch is on. When the emergency firing voltage trigger level set to a high level (up to 90% of the thyristor voltage rating) the capacitor in the snubber circuit normally associated with each thyristor will be charged to higher voltage levels and the energy dissipation in the subber resistor during continuous emergency firing will be much higher than that corresponding to normal operating conditions. The continuous turn-on with the maximum snubber discharge current can also reduce the operating life of the thyristor. Additional problems may arise due to poorer controllability of the thyristor valve where a faulty gate firing channel is present. Instead of starting precisely at the instant of the gate firing signal, the conduction of the thyristor valve may be delayed until the thyristor valve voltage reaches the level set for the emergency firing of the device having a faulty gate firing channel. In the specific case of a static VAR compensator, this can result in excessive generation of harmonics in a thyristor-switched capacitor bank or in an undesirable dc offset in a thyristor-controlled reactor bank.

Conventional emergency firing circuits use values for the emergency triggering levels that are high with respect to the rate values of the thyristors for reasons of efficiency and economy of operation. However, it would be advantageous to have a circuit that would allow emergency firing at high levels yet reduce the stress in the thyristor should repeated firing of the thyristors under emergency condition be required. It is one object of the invention to provide initial firing of the thyristor at a high emergency triggering level approaching the voltage rating of the thyristor while providing a reduced triggering voltage level protection subsequent to the initial emergency triggering condition. This allows both economy of operation under normal operating conditions and protection of the individual thyristor and its associated snubber circuit during prolonged emergency firing conditions.

SUMMARY OF THE INVENTION

The invention is a method and a circuit for the emergency firing of individual thyristors using a protection circuit for providing an emergency gate control signal that is used to generate the gate firing pulse for the thyristor when the voltage applied thereto equals or exceeds a predetermined initial emergency voltage triggering level. The emergency voltage triggering level is then reduced in accordance with a particular protection strategy. For example, the emergency voltage triggering level can be lowered following two consecutive emergency firings. Alternatively, the current or the emergency dissipated in the snubber circuit can be monitored by electrical or thermal sensors and the lower emergency triggering voltage level activated if a preset current, energy dissipation, or temperature level is reached.

Once the emergency voltage triggering level is reduced, the subsequent firing of the thyristor by the protection circuit occurs when the applied voltage equals or exceeds the reduced emergency voltage triggering level. The initial emergency voltage triggering level is restored on the occurrence of one of the following: (a) the occurrence of the normal gate control signal to the thyristor; (b) the elapse of a predetermined time delay period commencing with the initial firing of the thyristor using the emergency gate control signal; or (c) the occurrence of the normal gate control signal after the elapse of a predetermined time delay period commencing with the initial firing of the thyristor by the protection circuit.

A variety of methods can be used to reduce the emergency voltage triggering level. These include reduction using a two voltage level approach—the initial emergency voltage triggering level and the reduced emergency voltage triggering level, and reduction in a time dependent manner, either continuously or in a series of discrete steps.

In one embodiment of the circuit the thyristor voltage is applied across a resistive voltage divider network having one of its resistor in parallel with a normally closed shunt switch. A reduced value voltage output from the voltage divider is then compared against a reference value. After the initial occurrence of a thyristor voltage that produces an output from the voltage divider that is in excess of the reference value, a latch is set, opening the shunt switch and inserting the additional resistance into the voltage divider in a manner to increase the output of the voltage divider. In this manner the value for the emergency voltage triggering level is lowered. Resetting the latch closes the shunt switch. In another embodiment, a discrimination and integration circuit is used to monitor the current discharges in the associated snubber circuit. The occurrence of discharges in excess of a minimum level and duration effects the switching from the initial emergency voltage triggering level to the reduced emergency voltage triggering level. In a third embodiment two series connected breakover diodes and a current transformer are connected between the gate and anode of the thyristor. Connected in parallel with one of the breakover diodes is a normally open switch or relay contact. The current pulse resulting from the initial breakdown of both diodes is sent via the current transformer to a switch or relay control circuit that closes the switch or relay contact, shunting the breakover diode and reducing the emergency voltage triggering level. In a further embodiment in addition to the resistive voltage divider having the switch shunted resistor, a discrimination control circuit monitors current discharges in the snubber circuit and operates the shunt switch of the voltage divider.

BRIEF DESCRIPTION OF THE DRAWINGS

For a better understanding of the invention reference may be made to the embodiment exemplary of the invention shown in the accompanying drawings wherein.

DETAILED DESCRIPTION

The problems associated with the operation of one or more thyristors in a series connected thyristor valve or switch can be avoided if the individual local overvoltage protection circuits for each thyristor can be preset to at least two different emergency trigger voltage levels. In normal operation, the protection circuit would be initially preset to a emergency voltage triggering level which permits full utilization of the thyristor rating. If any thyristor in the thyristor switch loses its normal gate firing control signal and consequently starts turning on repetitively at the high emergency voltage triggering levels then the emergency voltage triggering level for that thyristor is reduced to a level at which the thyristor and its associated snubber circuit components can be operated continuously without being overstressed.

Figure 1:
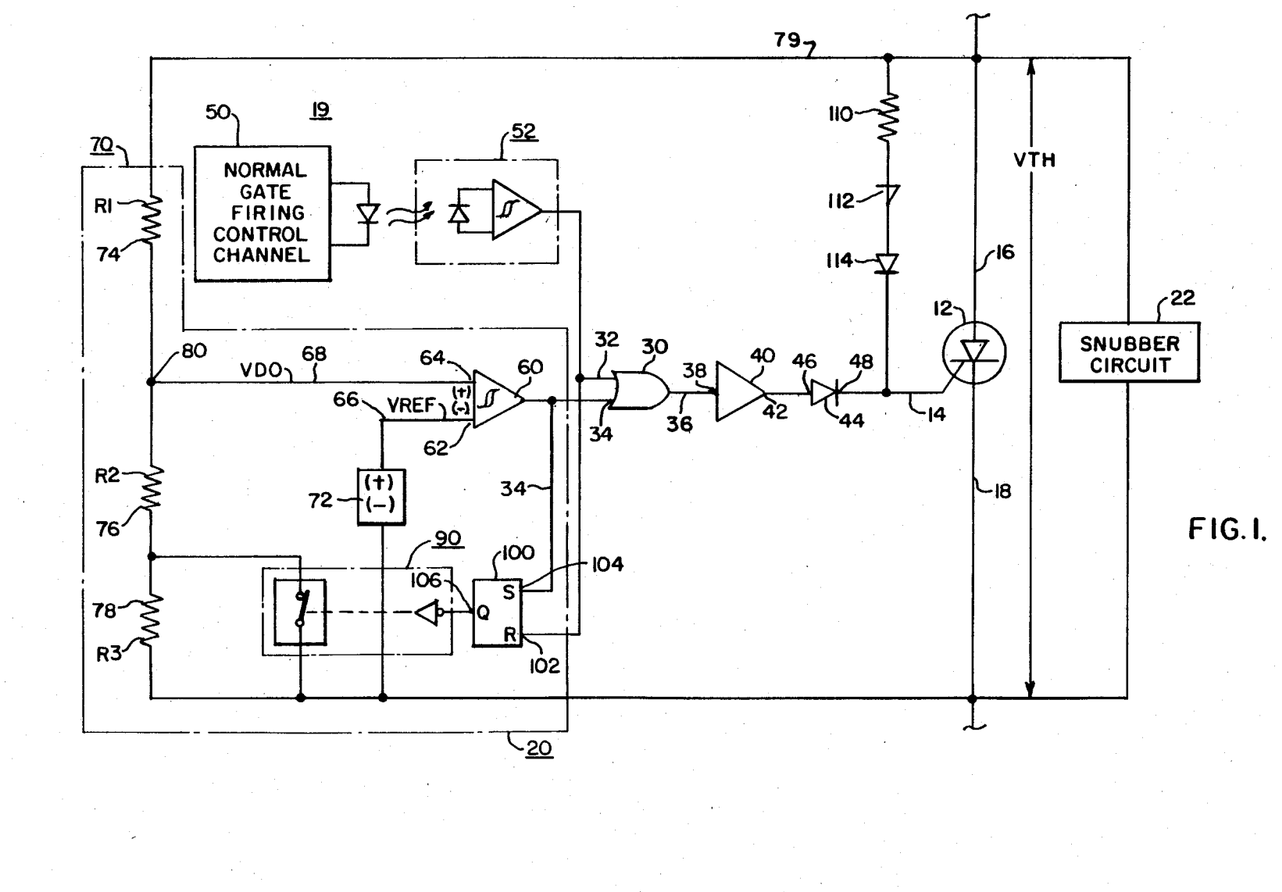
FIG. 1 is a simplified schematic representation of a circuit embodying the present invention using a resistive voltage divider having a switch shunted resistor to effect reduction in the emergency voltage triggering level.

Shown in FIG. 1, is a thyristor 12 having a gate 14, an anode 16, and a cathode 18 and representing one thyristor of a thyristor valve. An individual firing circuit 19 incorporating a local overvoltage firing circuit 20 is provided for each thyristor 12. A snubber circuit 22 is also provided in parallel with the thyristor 12 connected to the anode 16 and cathode 18 thereof to limit the dv/dt stress and/or to facilitate voltage sharing among the individual thyristors that comprise the thyristor switch. The gate 14 of the thyristor is controlled by a two input OR gate 30. Serving as inputs to the OR gate 30 are the normal gate control signal 32 and the emergency firing signal 34. The output 36 of the OR gate 30 is connected to the input 38 of gate pulse generator 40 with the output 42 thereof being connected to anode 46 of the isolation diode 44. The cathode 48 of the diode 44 is connected to the gate 14 of the thyristor 12. The gate pulse generator 40 provides a gate signal for the actual firing of the thyristor 12. The normal gate control signal 32 is provided by a gate firing control channel 50 via an electro-optical link whose output from detector 52 is the signal 32 that is used to initiate the firing of the thyristor 12 in response to the signals generated by the control channel circuit during normal operation of the thyristor 12. The emergency firing signal 34 is the output of a comparator 60 having at its inverting input 62 and noninverting input 64, respectively, a reference voltage VREF 66 and the output voltage VDO 68 from a voltage divider 70 connected in parallel with the thyristor 12. The reference voltage VREF 66 is produced by the voltage source 72 shown connected to the inverting input 62. The voltage source 72 is a stable voltage source such as that provided by a cell or zener diode. The value selected for VREF 66 and the desired emergency triggering voltage level determine the values of the resistances chosen for the voltage divider 70. Typically, VREF is chosen such that when the actual applied thyristor voltage is initially in excess of 85% of the thyristors rated value the comparator will produce the emergency firing signal 34. This ensures that the protection circuit will not interfere with normal operation of the thyristor.

For purposes of illustration the voltage divider 70 includes three series connected resistors R1, 74, R2, 76, and R3, 78 with resistors R1 and R3 also being connected to the anode 16 and cathode 18, respectively, of the thyristor 12. Thus, the voltage VTH, 79 across the thyristor 12 also appears across the voltage divider 70. The voltage divider output 80 is between resistors R1, 74 and R2, 76 and connected to noninverting input 64 of the comparator 60. Provided in parallel with resistor R3, 78 is an voltage driven analog switch 90 that is active low, i.e. the switch is closed when the switch input is low. The normal gate control signal 32 and the emergency firing signal 34 are connected to the inputs of a latch 100 having a reset input R, 102, a set input S, 104 and an output Q, 106. The normal gate control signal 32 and the emergency firing signal 34 are connected to the R and S inputs 102 and 104, respectively, of the latch 100. The Q output 106 of the latch 100 serves as the input to the voltage driven analog switch 90. Preferably, the latch 100 is constructed from MOSFETS for they permit operation over a wide range of voltages, typically 3–60 volts.

In normal operation when the normal gate control signal 32 is present, the latch 100 is reset causing the Q output 106 to be low, turning on the voltage driven analog switch 90 to short circuit resistor R3, 78 of the voltage divider 70. This means that, initially, a higher applied voltage across the thyristor 12 is required before the output voltage VDO, 68 at the voltage divider 70 will exceed the reference voltage VREF, 66 and cause the output of the comparator 60 to go high (change from a logic zero to a logic one). This causes the output of the OR gate 30 to go high causing a gate firing signal 42 to be transmitted to the thyristor 12. Simultaneously, the comparator output will set the latch 100 causing the Q output 106 to go high, opening the voltage driven analog switch 90 and inserting the resistor R3, 78 into the voltage divider 70. With the addition of resistor R3, 78 into the voltage divider 70, the voltage VDO appearing at the output 80 of the voltage divider 70 will be greater fraction of the voltage VTH appearing across the thyristor. Thus, a lower overvoltage condition across the thyristor 12 will now produce an output voltage VDO, 68 in excess of the reference voltage VREF, 66. Thus, even though the reference voltage VREF, 68 has remained unchanged, the emergency voltage triggering level has been reduced. The next occurrence of the normal gate control signal 32 will reset the latch 100, restoring the higher initial emergency voltage triggering level for the thyristor.

An examination of the circuit of FIG. 1 shows that a two level emergency firing of the thyristor is achieved. The initial value for the emergency voltage triggering level, designated as VTL(1), is determined using equation (1). The value for the subsequent emergency voltage triggering level, designated as VTL(2) is given by equation (2).

$$VTL(1) = \frac{R1 + R2}{R2} \times VREF \quad (1)$$

$$VTL(2) = \frac{R1 + R2 + R3}{R2 + R3} \times VREF \quad (2)$$

These equations show that a lower value of thyristor voltage VTH will produce emergency triggering when the resistor R3, 78 is inserted, as in equation (2).

In addition to the protection circuit 20 a breakover diode circuit can also be provided. This is shown by the series combination of a resistor 110, a breakover diode 112 and an isolation diode 114 connected, in the order given, between the cathode 16 and the gate 14 of the thyristor 12. The cathode of the breakover diode 112 is connected to the anode of the isolation diode 114 the cathode of which is connected to the gate 14. When the applied voltage to the breakover diode exceeds its breakover rating, a current pulse will be produced firing the gate 14. The resistor 110 limits current flow once the breakover diode starts to conduct. In order not to interfere with the normal and emergency firing produced by the circuit 19, the breakover diode 114 must be chosen so that it will operate at a voltage level higher then VTL(1) yet still less than the rating of the thyristor.

Additional logic circuitry can be provided to incorporate a time delay into the circuit of FIG. 1 such that after the initial emergency firing of the thyristor occurs, the latch will be automatically reset after the expiration of the preset time delay. For example the latch 100 can be replaced with a retriggerable monostable. The monostable, once triggered by the emergency firing signal 34, would automaticaly reset after the expiration of a predetermined time period provided no subsequent emergency firing signals arrive. The arrival of emergency firing signals during the timing period would restart the timing period. Alternatively, the resetting of the latch can be made as a logical combination of the expiration of the time delay period and the next subsequent occurrence of the normal gate control signal. Additional series and parallel combinations of resistors and switches each controlled by their own latching circuit can also be implemented with the circuit of FIG. 1. By adding appropriate control logic various discrete levels for the setting of the emergency voltage triggering levels can be achieved. An electronically controllable "variable resistor" or a controllable current sink may also be employed to achieve the reduction in the emergency triggering voltage level. One example of an electronically controllable "variable resistor" would be a MOSFET device operated in the linear mode.

Figure 2:
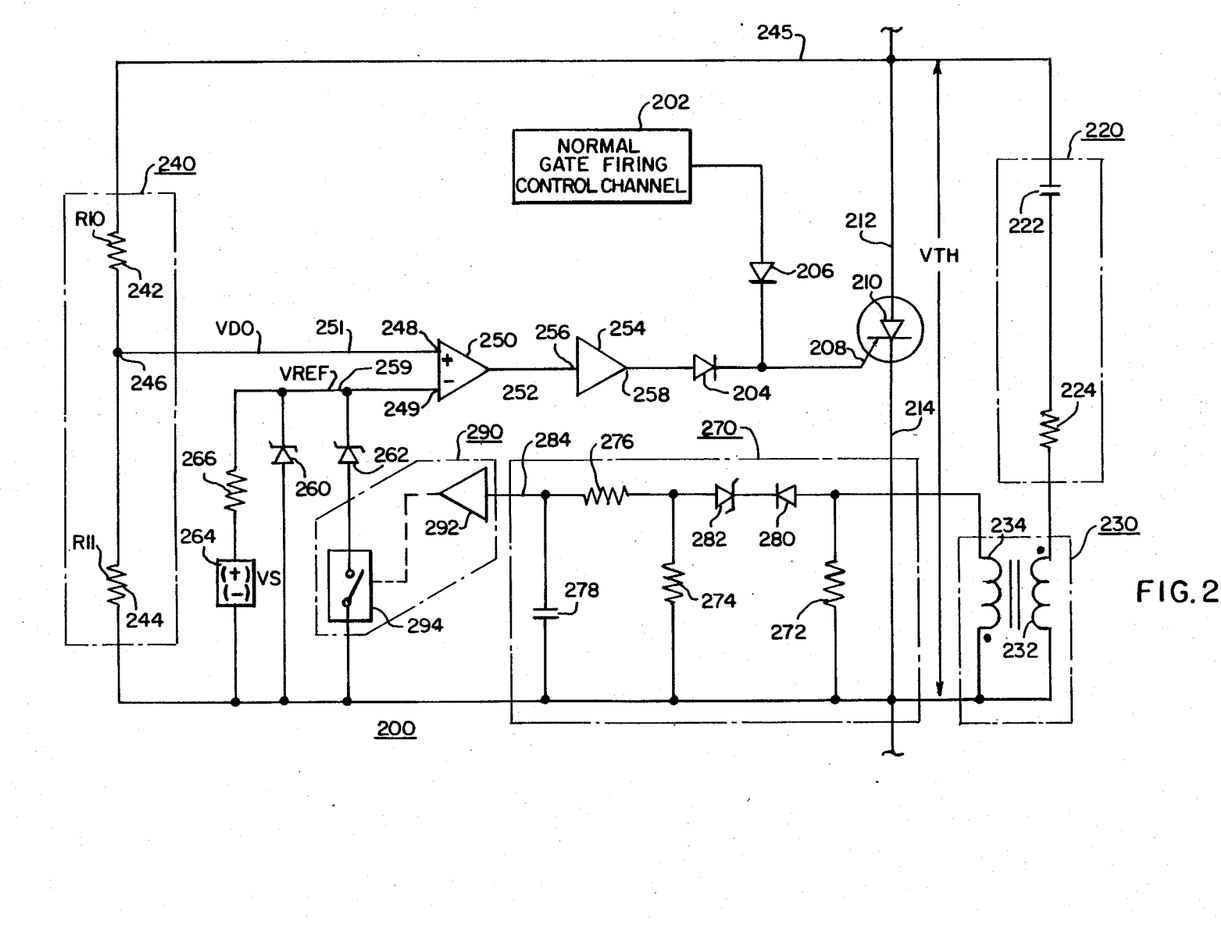
FIG. 2 is a simplified schematic representation of an alternate embodiment of the present invention using a discrimination and integration circuit for monitoring the current discharge of the snubber circuit and effecting the reduction in the emergency voltage triggering level.

Illustrated in FIG. 2 is a circuit 200 which uses a completely separate local overvoltage firing circuit "ORed" with the normal gate firing circuit 202. The emergency firing circuit 200 and the normal gate firing control channel 202 are connected to the anodes of isolation diodes 204 and 206, respectively, the cathodes of which are connected in common to the gate 208 of the thyristor 210 having an anode 212 and cathode 214. The diodes provide signal isolation between the two circuits 200 and 202. Connected in parallel with the thyristor 210 is a snubber circuit 220 consisting of the series connected capacitor 222 and resistor 224. A current transformer 230 is provided in series with the snubber circuit for monitoring the current discharge in the snubber circuit 220. The primary winding 232 is connected in series with the snubber circuit 220 and the system common which is the cathode 214 of the thyristor 210. The secondary winding 234 is connected to the system common and the discrimination and integration circuit 270 described hereinafter. A fixed ratio voltage divider 240, consisting of resistors R10,242 and R11, 244, is connected in parallel with the thyristor 210 at the anode 212 and cathode 214. Thus, the applied voltage across the thyristor VTH, 245 also appears across the voltage divider 240. The output 246 of the voltage divider 240 is taken between resistors R10, 242 and R11, 244 and is connected to the noninverting input 248 of the comparator 250. The voltage appearing at the voltage divider output 246 is designated VDO,251. The output 252 of the comparator is connected to a gate pulse generator 254 at its input 256. The output 258 of the gate pulse generator 254 is connected to the anode of blocking diode 204. The output voltage VDO,251 appearing at the noninverting input 248 to the comparator 250 is determined as set forth in equation 3.

$$VDO = \frac{R11}{R10 + R11} VTH \quad (3)$$

The reference voltage VREF, 259 that is applied to the inverting input 249 of the comparator 250 is determined by choosing one of two fixed reference voltages at least one of which can be switched into input 249 of the comparator 250. The reference voltage VREF, 259 is provided by either zener diode 260 or 262. Zener diode 260 provides the higher reference voltage. Zener diode 262 provides the lower reference voltage. The cathodes of these diodes are connected to the inverting input 249 of the comparator 250. The anode of zero diode 260 is connected to the system common. The anode of zener diode 262 is connected to the system common via a normally open voltage driven analog switch and serves as the switchable lower reference voltage. A voltage supply 264 having an output voltage value of VS and connected in series with resistor 266 is connected in parallel with the zener diode 260. The resistor 266 limits current through the zener diodes 260 or 262 depending on which one is in use. The value for VS is chosen to exceed the higher reference voltage estalished by the zener diodes 260.

Selection of the reference voltage source is accomplished by the snubber current pulse discrimination and integration circuit 270 that is connected to the secondary winding 234 of the current transformer 230 and the system common. The discrimination and integration circuit 270 is comprised of the resistors 272, 274, and 276, capacitor 278, diode 280, zener diode 282. The output 284 of the circuit 270 is connected to the input of the voltage driven analog switch 290. The anode of diode 280 is connected to the secondary winding 234 of the current transformer 230 and to the resistor 272 that is also connected to the system common. Resistor 272 is a load resistor for the secondary winding 234. The cathode of diode 280 is connected to the cathode of zener diode 282. Connected between the anode of zener diode 282 and the system common is resistor 274. Also connected to the anode of zener diode 282 is resistor 276. This resistor is, in turn, connected in series with capacitor 278 that is also connected to the system common. The junction between resistor 276 and capacitor 278 is the output 284 of the circuit 270. The voltage driven analog switch 290 is used to connect the anode of zener diode 262 to the system common. This analog switch 290 is symbolically illustrated as the amplifier 292 connected by the dashed line to the switch contacts 294 that connect the anode of zener diode 262 to the system common. In addition, the breakover diode circuit shown in FIG. 1 can also be incorporated in the circuit shown in FIG. 2.

In operation the output voltage VDO,251 appearing at input 248 of the comparator 250 and which is representative of the voltage applied to the thyristor, is compared with one of the two reference voltages which are selected as needed. Initially, the high value reference voltage is present at input 249. To select the lower value reference voltage, the current in the thyristor's snubber circuit 220 is monitored via the current transformer 230. During normal thyristor operation, the current pulses occurring in the snubber circuit 220 during the turn on transients do not reach the level needed to produce voltage pulses at the secondary winding 234 having magnitudes in excess of the threshold voltage discrimination level determined by the breakdown voltage of the zener diode 282. Thus, the capacitor 278 of the integration portion of the circuit 270 is not charged, resulting in the voltage driven analog switch remaining open.

When a malfunction such as misfiring or loss of the normal firing input to the individual thyristor occurs, emergency firing will be initiated. During emergency firing, the thyristor turn on will result in a high magnitude discharge current in the snubber capacitor 222 producing voltage pulses at the secondary winding 234 of sufficient magnitude to exceed the discrimination threshold voltage. The voltage pulses in excess of the threshold voltage output through zener diode 282 are integrated by resistor 276 and capacitor 278. When the integrated voltage on the capacitor exceeds the control level of the analog switch 290, the switch contacts 294 close and select the reduced reference voltage for the comparator 250. The integration circuit makes the production circuit dependent on both the magnitude and frequency of the current discharges in the snubber circuit 220. Actuation of the switch 290 occurs when the integrated value of the current discharges exceeds the time constant of the integration circuit. Thus, a single voltage pulse of sufficient magnitude can charge the capacitor 278 or a series of lower magnitude pulses can achieve the same effect—an output to the voltage driven analog switch. When appropriate thresholds are chosen, the charge on the capacitor can be maintained by repetitive overvoltage firing at the reduced level. Once reduced, the lower reference level will be maintained until normal operation is resumed and/or the charge accumulated by capacitor 278 is allowed to bleed off through resistors 274 and 276. Other timing schemes can also be employed.

In the discrimination and integration circuit 270, the diode 280 is used to prevent quick discharge of the capacitor 278 back through the zener diode 282. Resistors 274 and 276 serve as a discharge path for the capacitor 278. Preferably, the value of resistor 274 is about an order of magnitude greater than that of resistor 276 in order to slow down the discharge rate of the capacitor 278. Preferably, the voltage driven analog switch has hysteresis in order to prevent rapid operations of the switch for slight fluctuations in the value at its input generated by the integration and discrimination circuit 270. The comparator 250 as well as the comparator 60 of FIG. 1 also can use hysteresis. As in the circuit of FIG. 1, the magnitude of the reference voltage is dependent on the ratings and operating conditions of the thyristor.

Figure 3:
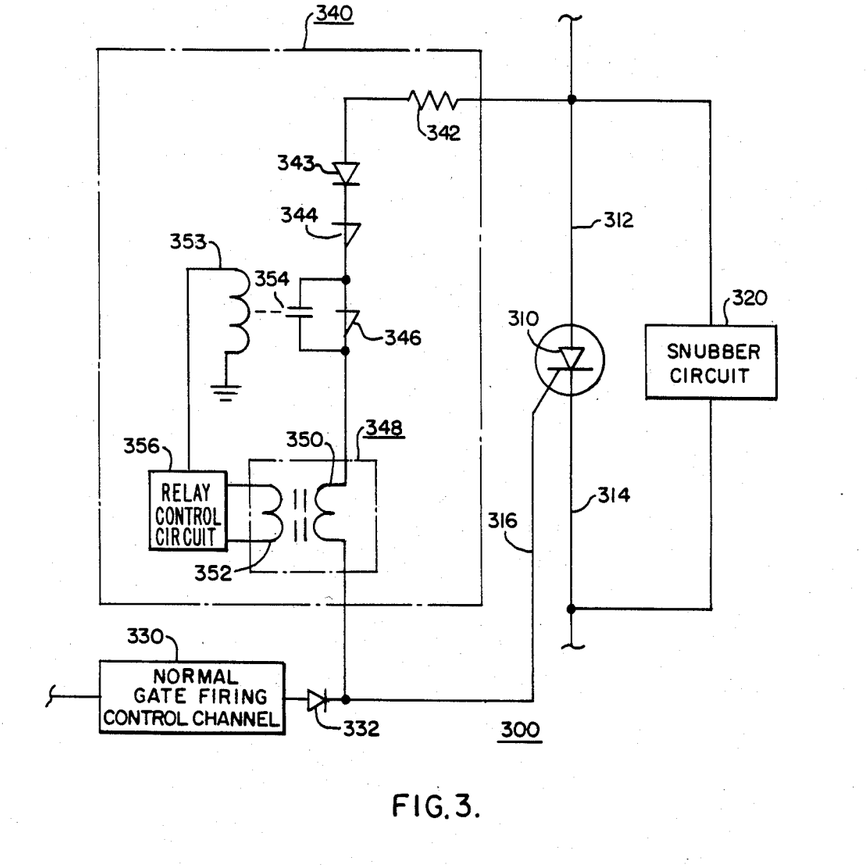
FIG. 3 is a simplified schematic representation of an alternate embodiment of the invention utilizing series connected breakover diodes to achieve the reduction in the emergency voltage triggering level.

A further embodiment of the invention is shown in FIG. 3 utilizing a dual breakover diode arrangement. The circuit comprises a thyristor 310 having an anode 312, a cathode 314 and a gate 316, a snubber circuit 320, a normal gate firing control channel 330 including an isolation diode 332, and an emergency firing circuit 340. The emergency firing circuit includes a resistor 342, a diode 343, two breakover diodes 344 and 346, a current transformer 348 having a primary winding 350 and a secondary winding 352, a relay 353 having a normally open contact 354 and a relay control circuit 356. The snubber circuit 320 is connected to the anode 312 and the cathode 314 forming a parallel combination with the thyristor 310. The normal gate firing control channel 330 is connected to the anode of the isolation diode 332 that has its cathode connected to the gate 316. The protection circuit 340 is connected between the anode 312 and the gate 316 of the thyristor. Connected in series starting at the anode 312 is the resistor 342 that is connected to the anode of diode 343. The cathode of diode 343 is connected to the anode of breakover diode 344 that has its cathode connected to the anode of breakover diode 346. The cathode of breakover diode 346 is connected to the primary winding 350 of the current transformer 348 that is connected to the gate 316 of the thyristor 310. The normal gate firing control channel 330 and the protection circuit 340 are connected in a logical OR configuration to the gate 316. The input of relay control circuit 356 is connected to the secondary winding 352 of the current transformer 348. The output of the relay control circuit 356 is connected to the relay 353. The normally open contact 354 is connected in parallel with the breakover diode 346.

For this circuit when the off-state voltage across the thyristor 310 exceeds the total voltage rating of the two breakover diodes, both diodes will trigger and a current pulse limited by the resistor 342 will flow into the thyristor gate 316. The thyristor 310 will turn on and the current will be diverted from the breakover diode circuit through the thyristor 310. Using the current transformer 348, the relay control circuit 356 senses the current pulse through the breakover diodes when overvoltage firing occurs and causes the relay 353 to be energized. The relay 353 functions as a controllable switch for shunting one of the breakover diodes, here breakover diode 346. The relay control circuit 356 includes a means such as a retriggerable monostable to maintain energization of the relay 353 subsequent to the initial overvoltage triggering. When the relay 353 is energized, the contact 354 closes, shorting out breakover diode 346. With the breakover diode 346 being shunted, the emergency voltage triggering level is lowered to the breakover voltage of the remaining unshunted breakover diode 344. Restoration of the higher triggering voltage, i.e. opening of the contact 354, can occur on the arrival of the next normal gate firing pulse. This pulse can be used to reset the monostable or the monostable can be allowed to time-out. Preferably, the combined breakover voltage ratings of the breakover diodes is equal to or greater than 85% of the voltage rating of the associated thyristor so as not to interfere with normal operation of the thyristor. The breakover voltage ratings of the individual diodes can be substantially equal or the breakover voltage rating of the unshunted breakover diode can be greater than or less than that of the shunted breakover diode. The breakover diodes 344 and 346 themselves can be constructed of one or more physical devices in order to achieve the desired breakover voltage rating needed. With suitable modification of the relay control circuit to include a multiple level sensing control, additional contact-shunted breakover diodes can be used allowing for more variability in selecting an emergency firing level. The breakover voltage rating of each breakover diode can be individually selected to match system operating and/or protection requirements.

Figure 4:
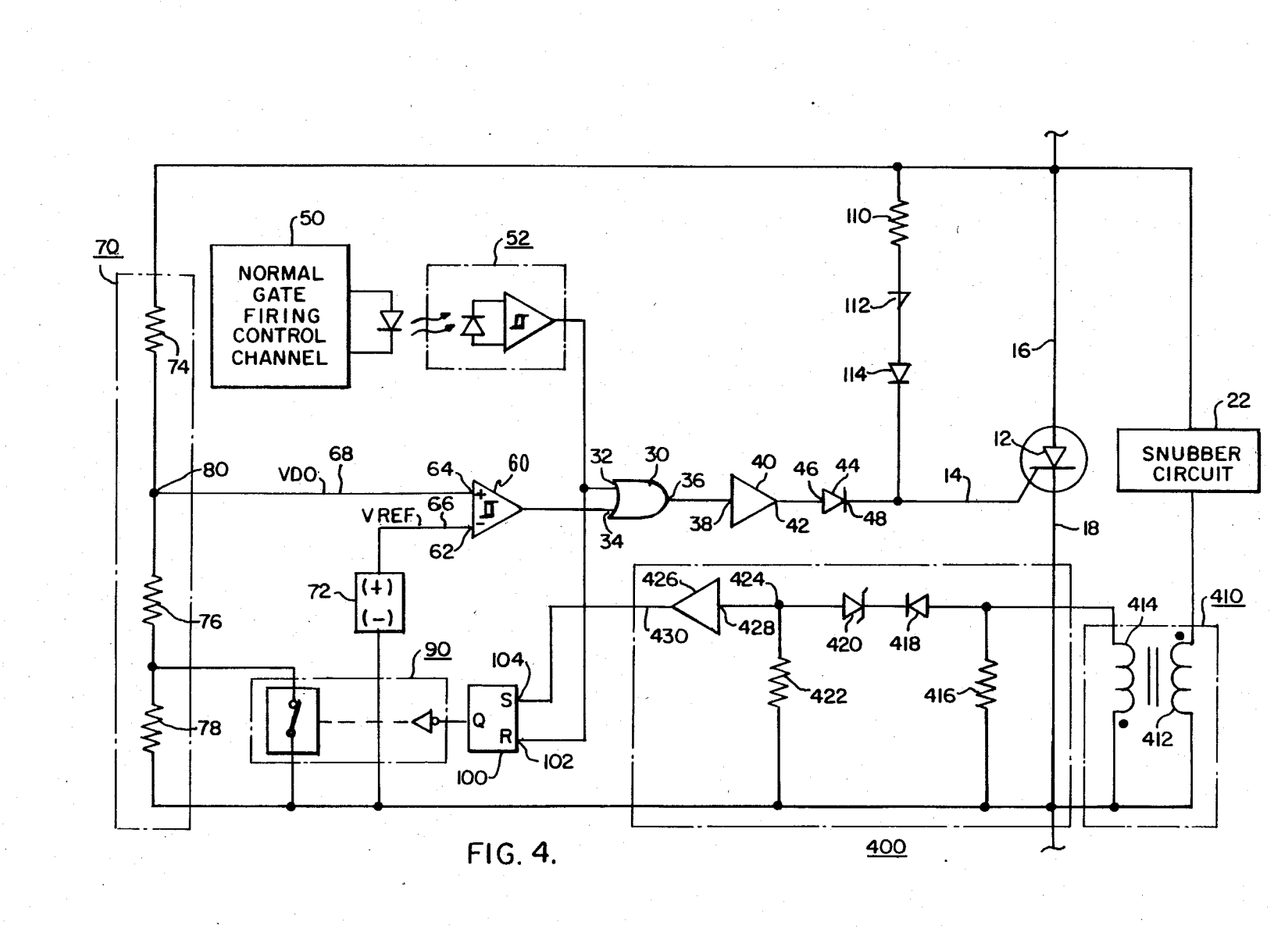
FIG. 4 is a simplified schematic representation of an alternate embodiment of the present invention using a discrimination circuit for monitoring the snubber circuit discharges and effecting a reduction in the emergency voltage triggering level.

In another embodiment of the invention a snubber circuit pulse actuated emergency firing circuit is used. This arrangement is illustrated in FIG. 4. The circuit is substantially similar to that shown in FIG. 1. Accordingly, components having the same function will carry the same identifying numerals. Only the modifications to the circuit will be described.

In the circuit of FIG. 4 a snubber pulse discrimination circuit 400 has been added to control the function of the latch 100. The S input 104 of the latch 100 was previously connected to the output of the comparator 60. The connection has been eliminated with the S input 104 now being connected to the output of the snubber pulse discrimination circuit 400. A current transformer 410 has been added to the snubber circuit 22. The primary winding 412 of the current transformer 410 is connected in series with the snubber circuit and the cathode 18 of the thyristor 12. Again the cathode 18 serves as the system common. Connected between the secondary winding 414 of the transformer 410 and the the system common is a resistor 416 that serves as a load for the transformer 410. A pulse discrimination circuit consisting of a diode 418, a zener diode 420, and a terminating resistor 422 is connected to the transformer secondary 414. The anode of diode 418 is connected in common with the secondary winding and resistor 416. The cathode of diode 418 is connected in series to the cathode of zener diode 420. The anode of zener diode 420 is connected in series to the resistor 422 that is then connected to the system common. The connection 424 between the anode of zener diode 420 and the resistor 422 is the output of the discrimination circuit. The output 424 is connected to a buffer 426 at its input 428. The output 430 of the buffer 426 is connected to the S input 104 of the latch 100.

The current pulse produced by the snubber circuit discharge creates a voltage pulse at the transformer secondary winding 414. Voltage pulses in excess of the breakover voltage of zener diode 420 will appear at the output 424 of the discrimination circuit. The buffer 426 will then take the voltage pulse signal appearing at its input 428 and convert to a form and level suitable for applying to the S input 104 of the latch 100. Occurrence of a voltage pulse of sufficient magnitude at the transformer 410 will cause the latch 100 to be set. This in turn will cause the Q output of the analog switch 90 to go to a logic high. With the Q output being high, the analog switch will open, inserting the resistor 78 into the voltage divider 72. The end result is a lowering in the emergency voltage triggering level.

For all the circuits illustrated, the decision to initially reduce the emergency voltage triggering level can be based on various circumstances. For example an occurrence of two consecutive emergency triggerings can be such a circumstance. The current or the energy dissipated in the snubber circuit can be monitored by electrical or thermal sensors and the lower emergency voltage triggering level activated if a preset current, energy dissipation, or temperature level is reached.

Once the individual emergency voltage triggering level is reduced, a decision must be made whether the reduction should be on a permanent or temporary basis. This decision will depend on specific operating conditions and requirements and on the potential for damage to the thyristor or the snubber circuit by the repetitive emergency firing at the high triggering voltage levels. Where the emergency firing is caused by the loss of the normal gate control signal, it may be necessary to reduce the triggering level permanently. However, if the emergency firing was a result of a dynamic condition caused by improper voltage distribution across the thyristor then the higher triggering voltage level could be restored immediately. A variety of alternatives between these two situations is possible if a suitable timing element is included. With the addition of the timing elements, as well as appropriate logic circuitry, several modes of operation are possible. These include:

(a) restoring the higher emergency voltage triggering level when a normal gate firing pulse occurs;
(b) restoring the higher emergency voltage triggering level automatically after a preset time delay;
(c) restoring the higher emergency voltage triggering level using a combination of (a) and (b);
(d) restoring the higher emergency voltage triggering level when the energy dissipation in the snubber circuit returns to a normal level; and
(e) restoring the higher emergency voltage triggering level using a combination of (a) and (d).

In addition more than two emergency voltage triggering levels can be used. The emergency triggering levels can be lowered in a time dependent manner commencing after the occurrence of the initial emergency firing of the thyristor. The emergency voltage triggering levels could be changed in a continuous manner or in discrete steps as time extends after the initial firing. A microprocessor can be utilized to achieve these modes of reduction. Where the current discharge of the snubber circuit is being monitored, the number of current pulses produced subsequent to the initial emergency firing can be counted with the initial emergency triggering voltage level being restored when the count reaches n, a predetermined number preferably in the range of 1 to 10. The upper limit for the number n is dependent on the ratings of particular thyristor that is used and in some cases can exceed the range given.

The emergency firing systems described can be used in both ac and dc power applications. Other embodiments of the invention will be apparent to those skilled in the art from a consideration of the specification or from practice of the invention disclosed herein. It is intended that the specification be considered as exemplary only with the scope and spirit of the present invention being indicated by the following claims.

We claim:

1. In a circuit comprising one or more thyristors connected in series forming a thyristor valve, means for providing a normal gate control signal to each thyristor for controlling the time of firing thereof, snubber circuit means connected in parallel with each thyristor for limiting the dv/dt transients and to ensure voltage sharing between the thyristors in the valve, and protection circuit means for providing an emergency gate control signal for firing an individual thyristor when the voltage applied thereto equals or exceeds a predetermined emergency voltage triggering level, a method for the reduction of stress in the individual thyristors and their associated snubber circuits and for the alleviation of problems associated with the decreased controllability of the valve due to sustained emergency firing, comprising:
   initially firing a thyristor using the emergency gate control signal produced by the protection circuit when the voltage applied thereto equals or exceeds the emergency voltage triggering level;
   reducing the emergency voltage triggering level of the protection circuit; and
   subsequently firing the thyristor using the emergency gate control signal produced by the protection circuit when the applied voltage equals or exceeds the reduced emergency voltage triggering level.

2. The method of claim 1 further comprising restoring the emergency voltae triggering level to its initial value commencing immediately with the occurrence of the normal gate control signal.

3. The method of claim 1 further comprising restoring the emergency voltage triggering level to its initial value after the elapse of a predetermined time delay period commencing with the initial firing of the thyristor using the emergency gate control signal.

4. The method of claim 1 further comprising restoring the emergency voltage triggering level to its initial value on the next occurrence of the normal gate control signal after the elapse of a predetermined time delay period commencing with the initial firing of the thyristor using the emergency gate control signal.

5. The method of claim 1 further comprising reducing the value of the emergency voltage triggering level in a time dependent manner commencing after the initial firing of the thyristor using the emergency gate control signal.

6. The method of claim 5 further comprising reducing the value of the emergency voltage triggering level according to a predetermined series of discrete values until a predetermined minimum value for the emergency triggering voltage level is reached, each reduction in value occurring during predetermined time periods, the first of which commences with the initial firing of the thyristor using the emergency gate control signal.

7. The method of claim 5 further comprising restoring the emergency voltage triggering level to its initial value on the occurrence of one of the following:
   a. the occurrence of the normal gate control signal;
   b. the elapse of a predetermined time delay period commencing with the initial firing of the thyristor using the emergency gate control signal; and
   c. the next occurrence of the normal gate control signal after the elapse of a predetermined time delay period commencing with the initial firing of the thyristor using the emergency gate control signal.

8. The method of claim 1 further comprising:
   monitoring the magnitude of the discharge current in the snubber circuit and producing a signal representative of the magnitude of the discharge current;
   comparing the signal representative of the discharge current to a predetermined threshold level; and
   reducing the emergency voltage triggering level of the protection circuit when the signal representative of the discharge current equals or exceeds the threshold level.

9. The method of claim 8 further comprising restoring the emergency voltage triggering level to its initial value commencing immediately with the occurrence of the normal gate control signal.

10. The method of claim 8 further comprising restoring the emergency voltage triggering level to its initial value after the elapse of a predetermined time delay period commencing with the initial firing of the thyristor using the emergency gate control signal.

11. The method of claim 8 further comprising restoring the emergency voltage triggering level to its initial value on the next occurrence of the normal gate control signal after the elapse of a predetermined time delay period commencing with the initial firing of the thyristor using the emergency gate control signal.

12. The method of claim 8 further comprising reducing the value of the emergency voltage triggering level in a time dependent manner commencing after the initial firing of the thyristor using the emergency gate control signal.

13. The method of claim 8 further comprising reducing the value of the emergency voltage triggering level according to a series of predetermined discrete values until a predetermined minimum value for the emergency voltage triggering level is reached, each reduction in value occurring during predetermined time periods, the first of which commences with the initial firing of the thyristor using the emergency gate control signal.

14. The method of claim 13 further comprising restoring the emergency voltage triggering level to its initial value on the occurrence of one of the following:
   a. the occurrence of the normal gate control signal;
   b. the elapse of a predetermined time delay period commencing with the initial firing of the thyristor using the emergency gate control signal; and
   c. the next occurrence of the normal gate control signal after the elapse of a predetermined time delay period commencing with the initial firing of the thyristor using the emergency gate control signal.

15. The method of claim 8 further comprising:
   counting the discharges of the snubber circuit; and
   restoring the emergency voltage triggering level to its initial value when the count equals n.

16. The method of claim 15 wherein n is in the range of 1 to about 10.

17. In a circuit comprising one or more thyristors connected in series forming a thyristor valve, means for providing a normal gate control signal to each thyristor for controlling the time of firing thereof, snubber circuit means connected in parallel with each thyristor for limiting the dv/dt transients and ensuring voltage sharing between the thyristors in the valve, and protection circuit means for providing an emergency gate control signal for firing an individual thyristor when the voltage applied thereto equals or exceeds a predetermined emergency voltage triggering level, the protection circuit comprising control circuit means, switch means, and two breakover diodes and a monitoring means connected in series between the anode and cathode of each thyristor, the breakover diodes conducting when the voltage applied thereto is equal to or greater than the combined breakover voltage rating of the diodes with the combined rating thereof being equal to the predetermined emergency voltage triggering level, the conduction of the breakover diodes producing an emergency gate current pulse sufficient for firing of the thyristor, the monitoring means producing a signal representative of the current flowing in the breakover diodes, control circuit means for controlling the operation of the protection circuit and for comparing monitoring means signal to a predetermined threshold level, a switch means responsive to the control circuit and connected in parallel with one the breakover diodes for shunting the breakover diode when closed, a method for the reduction of stress in the individual thyristors and their associated snubber circuits and for the alleviation of problems associated with the decreased controllability of the valve due to sustained emergency firing, comprising:

monitoring the magnitude of the current flowing through the breakover diodes of the protection circuit and producing a signal representative of the magnitude of the current; and     closing the switch means of the protection circuit when the signal representative of the breakover diode current equals or exceeds the predetermined threshold level of the control circuit means thereby shunting one of the breakover diodes and reducing the breakover voltage to that of the remaining breakover diode thus reducing the emergency voltage triggering level with subsequent firing of the thyristor by the protection circuit occurring when the remaining breakover diode conducts.

18. The method of claim 17 further comprising opening the switch of the protection circuit commencing immediately with the occurrence of the normal gate control signal.

19. The method of claim 17 further comprising opening the switch of the protection circuit after the elapse of a predetermined time delay period commencing with the initial firing of the thyristor caused by the initial emergency gate current pulse.

20. The method of claim 17 further comprising opening the switch of the protection circuit on the next occurrence of the normal gate control signal after the elapse of a predetermined time delay period commencing with the initial firing of the thyristor using the emergency gate current pulse.

21. The method of claim 17 further comprising:
    counting the emergency gate current pulses produced by the breakover diode; and
    reopening switch of the protection circuit when the count equals n.

22. The method of claim 21 wherein n is in the range of 1 to about 10.

23. The method of claim 17 wherein the breakover voltage rating of each of the breakover diodes is substantially equal to one another.

24. The method of claim 17 wherein the breakover voltage rating of the unshunted breakover diode is greater than that of the shunted breakover diode.

25. The method of claim 17 wherein the breakover voltage rating of the unshunted breakover diode is less than that of the shunted breakover diode.

26. In a circuit comprising one or more thyristors connected in series forming a thyristor valve, means for providing a normal gate control signal to each thyristor for controlling time of firing thereof, snubber circuit means connected in parallel with each thyristor for limiting the dv/dt transients and to ensure voltage sharing between the thyristors in the valve, and protection circuit means for providing an emergency gate control signal for firing an individual thyristor when the voltage applied thereto equals or exceeds a predetermined emergency voltage triggering level, a protection circuit for the reduction of stress in the individual thyristors and their associated snubber circuits and for the alleviation of problems associated with the decreased controllability of the valve due to sustained emergency firing, comprising:

first means for determining the occurrence of the initial firing of the thyristor by the protection circuit and producing an output representing such occurrence; and     second means responsive to the output of the first means for reducing the initial emergency voltage triggering level after the initial firing of the thyristor by the protection circuit whereby subsequent firing the thyristor by the protection circuit occurs when the voltage applied thereto equals or exceeds the reduced emergency voltage triggering level.

27. The circuit of claim 26 further comprising means for restoring the emergency voltage triggering level to its initial value commencing with occurrence of the normal gate control signal.

28. The circuit of claim 26 further comprising means for restoring the emergency voltage triggering level to its initial value after the elapse of a predetermined time delay period commencing with occurrence of the output of the first means.

29. The circuit of claim 26 further comprising means for restoring the emergency voltage triggering level to its initial value on the next occurrence of the normal gate control signal after the elapse of a predetermined time delay period commencing with the occurrence of the output of the first means.

30. The circuit of claim 26 wherein the second means further comprises means for reducing the value of the emergency voltage triggering level in a time dependent manner commencing with the occurrence of the output of the first means.

31. The circuit of claim 30 wherein the second means further comprises means for reducing the value of the emergency voltage triggering level according to a predetermined series of discrete decreasing values until a predetermined minimum value for the emergency voltage triggering level is reached with each reduction in value occurring during predetermined time periods, the first of which commences with the occurrence of the output of the first means.

32. The circuit of claim 30 further comprising means for restoring the emergency voltage triggering level to its initial value on the occurrence of one of the following:
  a. the occurrence of the normal gate control signal;
  b. the elapse of a predetermined time delay period commencing with the occurrence of the output of the first means; and
  c. the next occurrence of the normal gate control signal after the elapse of a predetermined time delay period commencing with the occurrence of the output of the first means.

33. The circuit of claim 26 further comprising:
means for monitoring the current discharges in the snubber circuit and having an output on the occurrence of a discharge with the second means responsive to the output for reducing the emergency voltage triggering level after the initial discharge of the snubber circuit.

34. The circuit of claim 33 wherein the means for monitoring the current discharges in the snubber circuit further comprises:
  level discrimination means for comparing the magnitude of the current discharges to a threshold value below which no output from the monitoring means will occur.

35. The circuit of claim 34 further comprising integrating means for integrating the current discharges having a magnitude in excess of the threshold value and producing the output to the second means dependent on the combination of the frequency and the magnitude of the current discharges with the output to the second means occurring when the integrated value of the current discharges exceeds the time constant of the integrating means.

36. The circuit of claim 35 further comprising means for restoring the emergency voltage triggering level to its initial value on the occurrence of one of the following:
  a. when the time of the last occurrence of snubber circuit discharge equals or exceeds a predetermined time period; and
  b. magnitude of the current discharge is less than or equal to a predetermined value; and
  c. the occurrence of the normal gate control signal.

37. The circuit of claim 33 wherein the means for monitoring the current discharges in the snubber circuit further comprises:
  discharge counting means for counting the current pulses produced by the discharge of the snubber circuit, the counting means producing the output to the second means when the count equals n.

38. The circuit of claim 37 wherein n is in the range of 1 to about 10.

39. In a circuit comprising one or more thyristors connected in series forming a thyristor valve, means for providing a normal gate control signal to each thyristor for controlling the time of firing thereof, snubber circuit means connected in parallel with each thyristor for limiting the dv/dt transients and ensuring voltage sharing between the thyristors in the valve, a protection circuit for the emergency firing of a thyristor in the thyristor valve and reducing of stress in the individual thyristors and their associated snubber circuits and for the alleviation of problems associated with the decreased controllability of the valve due to the emergency firing, comprising:
  a resistor-diode combination having a resistor connected in series with a diode;
  a first breakover diode, the anode thereof connected in series with the resistor-diode combination;
  a second breakover diode the anode thereof connected to the cathode of the first breakover diode with the combined breakover voltage rating of the first and second breakover diodes being equal to a predetermined emergency voltage triggering level;
  monitoring means connected in series with the first and second breakover diodes with the resulting combination connected between the anode and gate of the associated thyristor with the anodes and cathodes of the diode and the first and second breakover diodes having an orientation similar to the anode and cathode of the thyristor, the monitoring means producing a signal representative of the current flowing in the breakover diodes, the breakover diodes initially going in conduction when the voltage applied thereto is equal to or greater than the the combined breakover voltage of the breakover diodes thereby producing an emergency gate current pulse sufficient for firing the associated thyristor;
  control circuit means for controlling the operation of the protection circuit and receiving monitoring means signal; and
  switch means responsive to the control circuit means and connected in parallel with one the breakover diodes for shunting the breakover diode when closed whereby the control circuit means closes the switch means after the occurrence of the initial signal from the monitoring means, shunting the breakover diode and lowering the voltage at which a subsequent emergency gate pulse is produced to the breakover voltage of the unshunted breakover diode.

40. The circuit of claim 39 further comprising means for opening the switch means of the protection circuit commencing immediately with the feoccurrence of the normal gate control signal.

41. The circuit of claim 39 further comprising means for opening the switch means of the protection circuit after the elapse of a predetermined time delay period commencing with the initial firing of the thyristor caused by the initial emergency gate current pulse.

42. The circuit of claim 39 further comprising means for opening the switch means of the protection circuit on the next occurrence of the normal gate control signal after the elapse of a predetermined time delay period commencing with the initial firing of the thyristor using the emergency gate current pulse.

43. The circuit of claim 39 further comprising:
  means for counting the emergency gate current pulses of the breakover diodes; and
  means for reopening switch of the protection circuit when the count equals n.

44. The circuit of claim 43 wherein n is in the range of 1 to about 10.

45. The circuit of claim 39 wherein the breakover voltage rating of each of the breakover diodes is substantially equal to one another.

46. The circuit of claim 39 wherein the breakover voltage rating of the unshunted breakover diode is greater than that of the shunted breakover diode.

47. The circuit of claim 39 wherein the breakover voltage rating of the unshunted breakover diode is less than that of the shunted breakover diode.

* * * * *